US012812899B2

(12) United States Patent
Kou et al.

(10) Patent No.: US 12,812,899 B2
(45) Date of Patent: Nov. 24, 2026

(54) SPLIT GATE MOSFET AND MANUFACTURING METHOD THEREOF

(71) Applicant: Mosel Vitelic Inc., Hsinchu (TW)

(72) Inventors: Chia-Ming Kou, Hsinchu (TW); Cin-Hua Jheng, Hsinchu (TW); Wen-Wei Shih, Hsinchu (TW); Cheng-Wei Hsu, Hsinchu (TW); Hsien-Yi Cheng, Hsinchu (TW)

(73) Assignee: Mosel Vitelic Inc., Hsinchu (TW)

( * ) Notice: Subject to any disclaimer, the term of this patent is extended or adjusted under 35 U.S.C. 154(b) by 436 days.

(21) Appl. No.: 18/422,306

(22) Filed: Jan. 25, 2024

(65) Prior Publication Data

US 2024/0405121 A1 Dec. 5, 2024

(30) Foreign Application Priority Data

Jun. 2, 2023 (TW) ................................ 112120757

(51) Int. Cl.

| | |
|---|---|
| ***H10D 30/66*** | (2025.01) |
| ***H10D 30/01*** | (2025.01) |
| ***H10D 62/10*** | (2025.01) |
| ***H10D 64/00*** | (2025.01) |
| ***H10D 64/01*** | (2025.01) |

(Continued)

(52) U.S. Cl.

CPC ....... *H10D 30/668* (2025.01); *H10D 30/0297* (2025.01); *H10D 62/111* (2025.01); *H10D 64/01* (2025.01); *H10D 64/117* (2025.01); *H10P 30/21* (2026.01); *H10P 30/22* (2026.01)

(58) Field of Classification Search

CPC ............ H10D 30/668; H10D 30/0297; H10D 62/111; H10D 64/01; H10D 64/117; H10P 30/21; H10P 30/22

See application file for complete search history.

(56) References Cited

U.S. PATENT DOCUMENTS

2013/0256786 A1 10/2013 Hsieh
2013/0320435 A1* 12/2013 Ng .................... H10D 30/0295 438/270

(Continued)

FOREIGN PATENT DOCUMENTS

CN 116110944 A * 5/2023 ............ H10D 30/63
TW 201423995 A 6/2014

(Continued)

*Primary Examiner* — Davienne N Monbleau
*Assistant Examiner* — Heim Kirin Grewal
(74) *Attorney, Agent, or Firm* — KIRTON McCONKIE; Evan R. Witt

(57) ABSTRACT

The present disclosure provides a split gate MOSFET and a manufacturing method thereof. An epitaxy layer with a first conductivity type is formed on a substrate. A plurality of trenches are formed in the epitaxy layer. Impurities with a second conductive type is implanted and driven to the trenches to form a plurality of first doping areas. Since the first doping areas and none-doping areas of the epitaxy layer are alternately arranged with each other, and the first conductive type and the second conductive type are different conductivity types selected from P type or N type, the split gate MOSFET including the super junction structure is manufactured, and the advantages of simplifying manufacturing process, reducing cost and greatly reducing the on-resistance are achieved.

8 Claims, 21 Drawing Sheets

(51) Int. Cl.

| | |
|---|---|
| ***H10P 30/20*** | (2026.01) |
| ***H10P 30/22*** | (2026.01) |

(56) References Cited

U.S. PATENT DOCUMENTS

| | | | | |
|---|---|---|---|---|
| 2018/0358434 | A1 | 12/2018 | Nagase et al. | |
| 2023/0299194 | A1* | 9/2023 | Omizu | H10D 30/668<br>257/330 |

FOREIGN PATENT DOCUMENTS

| | | | | |
|---|---|---|---|---|
| TW | 202240907 | A | 10/2022 | |
| WO | WO-2021232813 | A1 * | 11/2021 | H10D 64/011 |

* cited by examiner

SPLIT GATE MOSFET AND MANUFACTURING METHOD THEREOF

CROSS-REFERENCE TO RELATED APPLICATION

This application claims priority to Taiwan Patent Application No. 112120757, filed on Jun. 2, 2023. The entireties of the above-mentioned patent applications are incorporated herein by reference for all purposes.

FIELD OF THE INVENTION

The present disclosure relates to a field-effect transistor, and more particularly to a split gate metal-oxide-semiconductor field-effect transistor and manufacturing method thereof.

BACKGROUND OF THE INVENTION

Generally, traditional MOSFETs (Metal-Oxide-Semiconductor Field-Effect Transistor) are mainly made of silicon. However, silicon has the high on-resistance, which limits the applications thereof.

In order to break through the silicon limit, some MOSFETs include super junction structures. In the case of the same area, the MOSFETs with the super junction structure have a lower on-resistance than the traditional MOSFETs. Common super junction processes include multi-epitaxial growth and implant, and deep trench and refill poly. However, the above-mentioned super junction processes are complicated and have high cost.

Therefore, there is a need of providing a split gate MOSFET and manufacturing method thereof to obviate the drawbacks encountered from the prior arts.

SUMMARY OF THE INVENTION

It is an objective of the present disclosure to provide a split gate MOSFET and manufacturing method thereof, the epitaxy layer with a first conductivity type is formed on the substrate, the plurality of trenches are formed in the epitaxy layer, and the impurities with a second conductive type is implanted and driven to the sidewall and the bottom of each of the trenches, so as to form the plurality of first doping areas. Since the plurality of first doping areas and the plurality of none-doping areas of the epitaxy layer are alternately arranged with each other, and the first conductive type and the second conductive type are different conductivity types selected from P type or N type, so that the split gate MOSFET including the super junction structure is manufactured, and the advantages of simplifying manufacturing process, reducing cost and greatly reducing the on-resistance are achieved In accordance with an aspect of the present disclosure, a manufacturing method of a split gate MOSFET is disclosed, and includes following steps: (a) providing a substrate, and forming an epitaxy layer with a first conductive type on the substrate; (b) forming a mask oxide layer on the epitaxy layer; (c) removing a part of the mask oxide layer and a part of the epitaxy layer to form a plurality of trenches T; (d) implanting first impurities with a second conductive type in a bottom and a sidewall of each of the trenches by an ion implanting process, and driving the first impurities to form a plurality of first doping areas in the epitaxy layer, wherein each of the first doping areas is diffused from the bottom and the sidewall of each of the trenches toward a direction away from the corresponding trenches, and a side of each of the first doping areas is diffused to in contact with the substrate, wherein the plurality of first doping areas and a plurality of none-doping areas of the epitaxy layer are alternatively arranged with each other, and the first conductive type and the second conductive type are different conductivity types selected from a P type or a N type; (e) forming bottom oxide layers, a first gates and a second gates in each of the trenches, wherein the first gate and the second gate are separately formed in the corresponding bottom oxide layers; (f) implanting second impurities on a second surface of the epitaxy layer by the ion implanting process, so as to form a plurality of second doping areas in the epitaxy layer, wherein each of the second doping areas is disposed between two neighboring trenches; (g) implanting third impurities on the second surface of the epitaxy layer by the ion implanting process, so as to form a plurality of a plurality of third doping areas in the epitaxy layer, wherein each of the second doping areas is disposed between the corresponding third doping area and the corresponding the none-doping area; (h) forming a dielectric layer on the mask oxide layer and the second gate; (i) removing a part of the dielectric layer, a part of the mask oxide layer and a part of the epitaxy layer to form a plurality of concaves; (j) forming a plurality of contact areas in the plurality of concaves; and (k) forming a metal layer on the dielectric layer and the plurality of contact areas.

In accordance with another aspect of the present disclosure, a split gate MOSFET is disclosed, and including a substrate, an epitaxy layer, a mask oxide layer, a plurality of split gate structures, a dielectric layer, a plurality of contact area and a metal layer. The epitaxy layer is formed on the substrate, has a first conductivity type and includes a first surface, a second surface, a plurality of none-doping areas, a plurality of first doping areas, a plurality of second doping areas and a plurality of third doping areas. The first surface and the second surface are two opposite surfaces of the epitaxy layer, and the first surface is in connection to the substrate. The plurality of none-doping areas and the plurality of first doping areas are alternately arranged with each other. The mask oxide layer is formed on the epitaxy layer. Each of the split gate structures includes a trench, a bottom oxide layer, a first gate and a second gate. The trench penetrates through the mask oxide layer, and is recessed from the second surface of the epitaxy layer toward the first surface. The bottom oxide layer is formed in the trench. The first gate and the second gate are formed in the bottom oxide layer and separated from each other. Each of the first doping areas is extended from a sidewall and a bottom of the corresponding one of the trenches toward the epitaxy layer and includes first impurities with a second conductivity type. The first conductivity type and the second conductivity type are different conductivity types. The plurality of third doping areas are disposed between two adjacent trenches, respectively, and in connection to the second surface. The plurality of second doping areas are disposed between two adjacent trenches, respectively, and in connection to the corresponding one of the third doping areas. The dielectric layer is formed on the mask oxide layer and the second gate. The plurality of concaves are recessed from a top surface of the dielectric layer toward the epitaxy layer. Each of the concaves penetrates the dielectric layer, the mask oxide layer and the third doping area, and at least a part of each of the concaves is formed in the second doping area. The plurality of contact areas are formed in the corresponding one of the plurality of concaves, respectively. The metal layer is formed on the dielectric layer and the plurality of contact areas.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
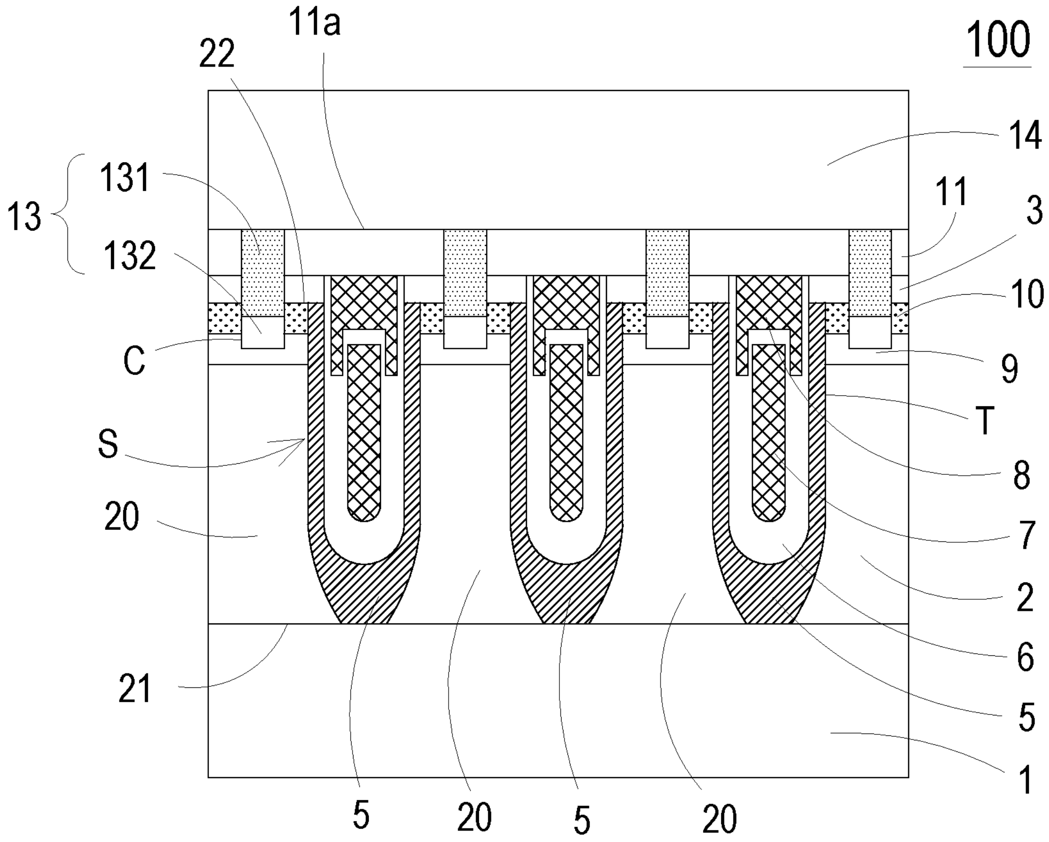
FIG. 1 is a cross-sectional view illustrating a split gate MOSFET according to an embodiment of the present disclosure.

FIG. 1 is a cross-sectional view illustrating a split gate MOSFET according to an embodiment of the present disclosure. As shown in FIG. 1, the split gate MOSFET 100 of the present embodiment includes a substrate 1, an epitaxy layer 2, a mask oxide layer 3, a plurality of split gate structures S, a dielectric layer 11, a plurality of contact areas 13 and a metal layer 14. The epitaxy layer 2 has a first conductivity type and is formed on the substrate 1. The epitaxy layer 2 includes a first surface 21, a second surface 22, a plurality of none-doping areas 20, a plurality of first doping areas 5, a plurality of second doping areas 9 and a plurality of third doping areas 10. The first surface 21 and the second surface 22 are two opposite surfaces of the epitaxy layer 2. The first surface 21 of the epitaxy layer 2 is in connection to the substrate 1. The mask oxide layer 3 is formed on the epitaxy layer 2. In other words, the second surface 22 of the epitaxy layer 2 is in connection to the mask oxide layer 3. The plurality of none-doping areas 20 and the plurality of first doping areas 5 are alternately arranged with each other. Each of the split gate structures S includes a trench T, a bottom oxide layer 6, a first gate 7 and a second gate 8. The trench T penetrates through the mask oxide layer 3, and is recessed from the second surface 22 of the epitaxy layer 2 toward the first surface 21. The bottom oxide layer 6 is formed in the trench T. The first gate 7 and the second gate 8 are formed in the bottom oxide layer 6 and separated from each other. Each of the first doping areas 5 is extended from an inner wall (a sidewall TS and a bottom TB shown in FIG. 4D) of the corresponding trench T toward the epitaxy layer 2. Each of the first doping areas 5 includes first impurities with a second conductivity type. The first conductivity type and the second conductivity type are different conductivity types, and may be P-type or N-type. The plurality of third doping areas 10 are disposed between two adjacent trenches T, respectively, and are in connection to the second surface 22. The plurality of second doping areas 9 are disposed between two adjacent trenches T, respectively, and in connection to the corresponding third doping areas 10. The dielectric layer 11 is formed on the mask oxide layer 3 and the second gate 8. The plurality of concaves C are recessed from the top surface 11*a* of the dielectric layer 11 toward the epitaxy layer 2. Each of the concaves C penetrates the dielectric layer 11, the mask oxide layer 3 and the third doping area 10. At least a part of the concave C is formed in the second doping area 9. The plurality of contact areas 13 are formed in the corresponding concaves C, respectively. The metal layer 14 is formed on the dielectric layer 11 and the plurality of contact areas 13, and is configured as a source. In the present embodiment, the substrate 1 can include but not limited to include N+ type semiconductors, the none-doping areas 20 of the epitaxy layer 2 can include but not limited to include P-type semiconductors, the first doping areas 5 can include but not limited to include N-type impurities, the second doping areas 9 can include but not limited to include P type impurities, the third doping areas 10 can include but not limited to include N+ type impurities. Since the none-doping area 20 and the first doping area 5 respectively include P-type semiconductor and N-type impurities, and are alternately arranged with each other, a super junction structure is formed therebetween, so as to achieve the effect of greatly reducing the on-resistance.

In the present embodiment, each of the contact areas 13 includes a first area 131 and a second area 132. The first area 131 is disposed in the bottom of the concave C, and is adjacent to the second doping area 9 and the third doping area 10. The second area 132 is disposed in the concave C, formed on the first area 131, and is adjacent to the third doping area 10, the mask oxide layer 3 and the dielectric layer 11. The first area 131 can include but not limited to include P type semiconductors, and the second area 132 can include but not limited to include N+ type semiconductors.

Figure 2A:
FIG. 2A to FIG. 2K schematically illustrate the flow structures of a manufacturing method of a split gate MOSFET according to an embodiment of the present disclosure.
Figure 2B:
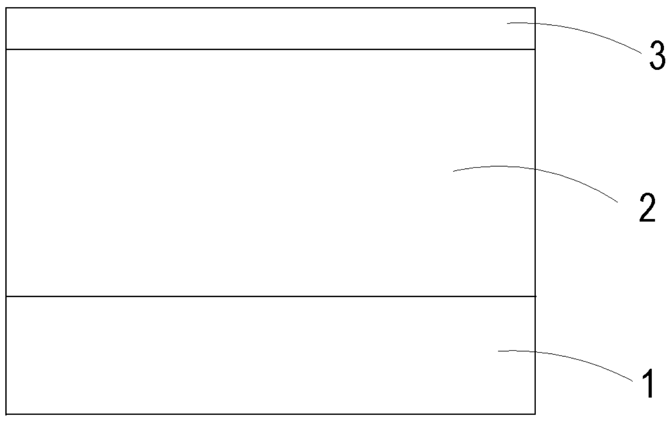
Figure 2C:
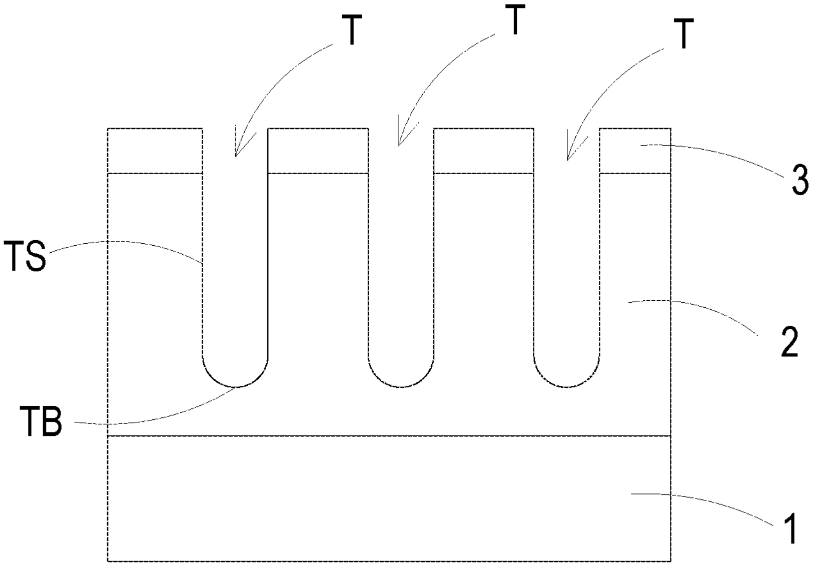
Figure 2D:
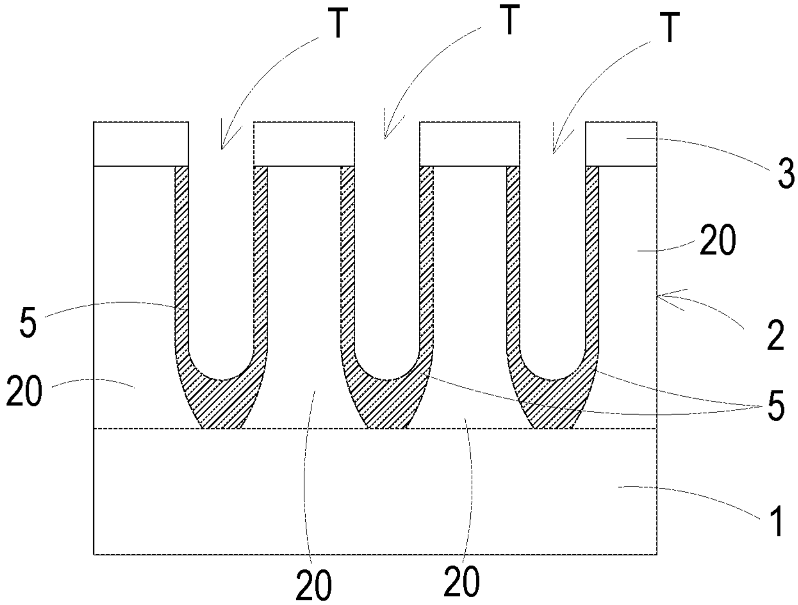
Figure 2E:
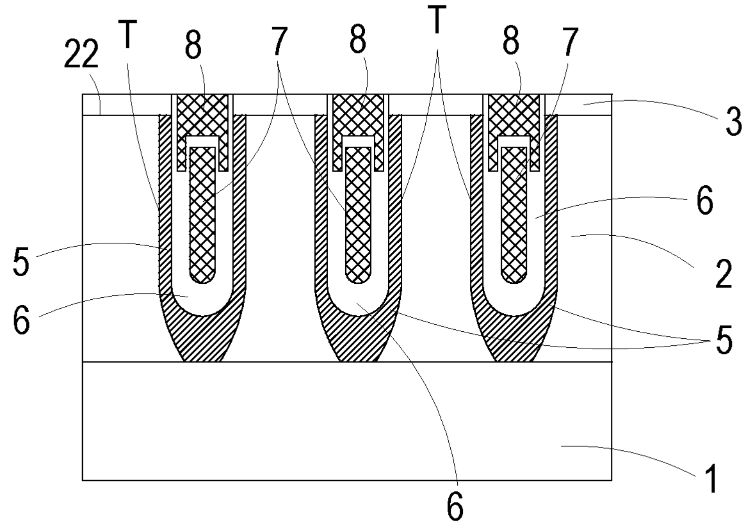
Figure 2F:
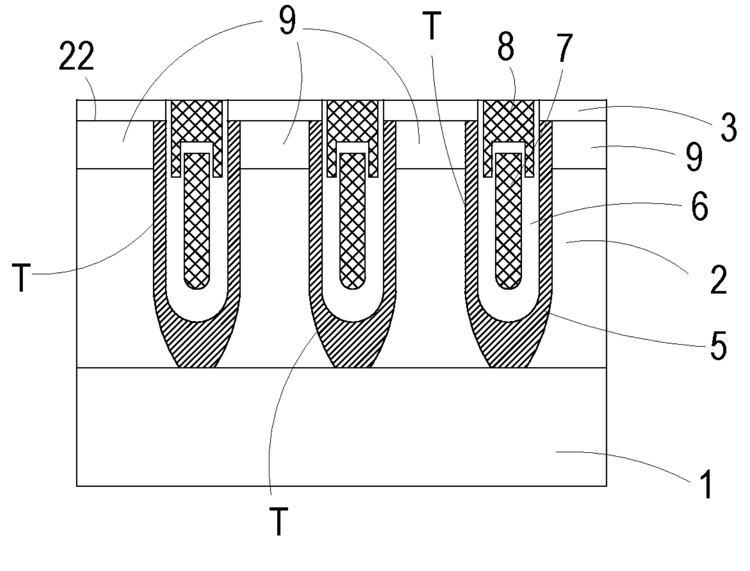
Figure 2G:
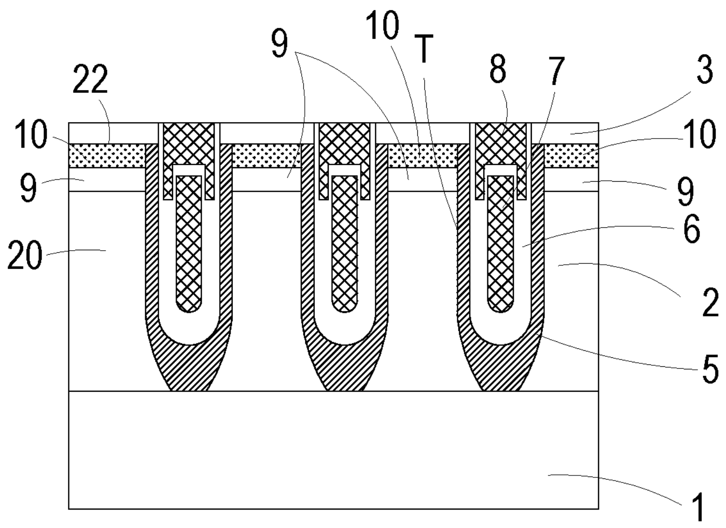
Figure 2H:
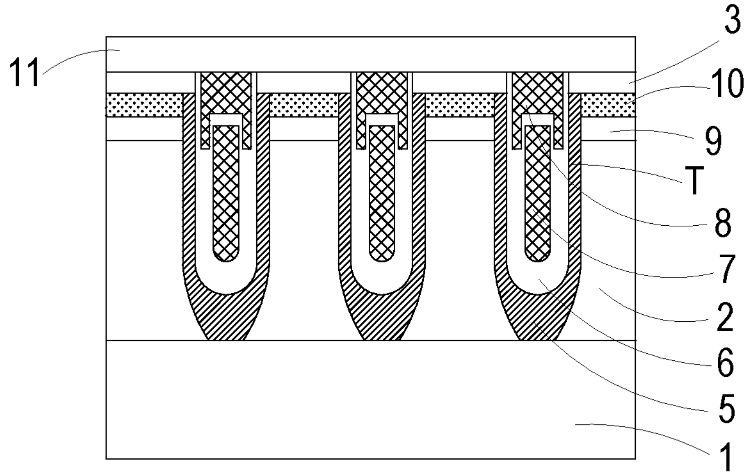
Figure 2I:
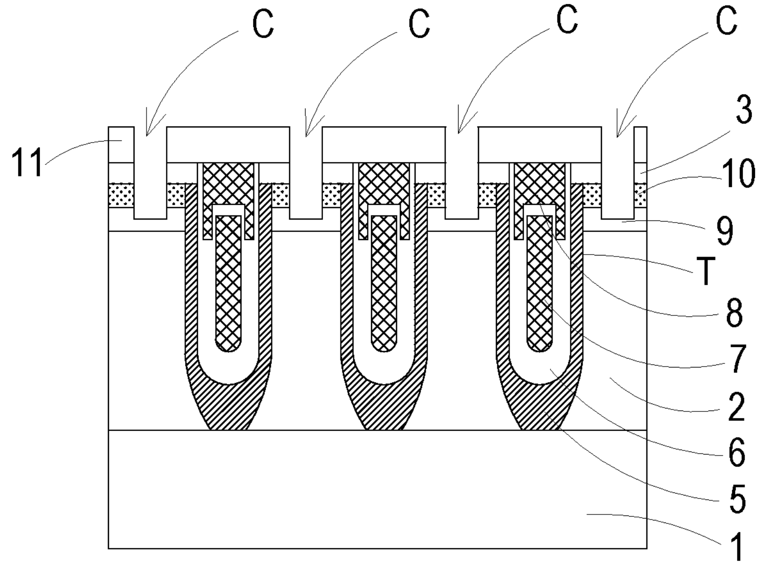
Figure 2J:
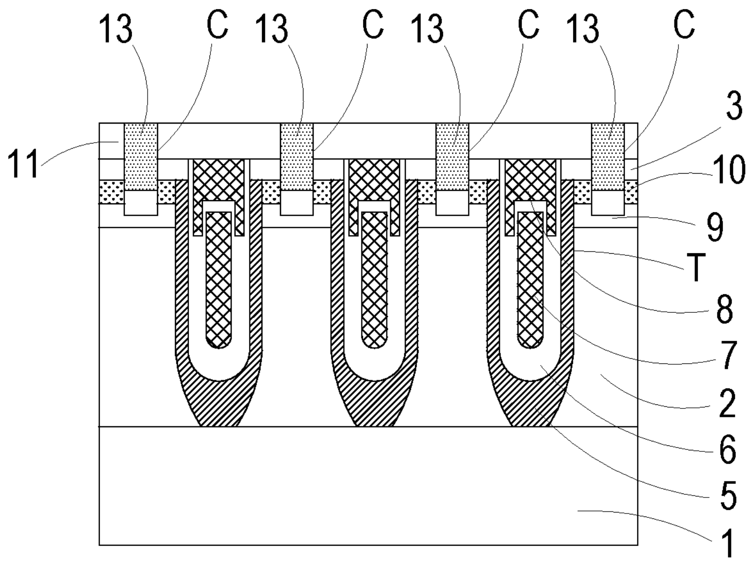
Figure 2K:
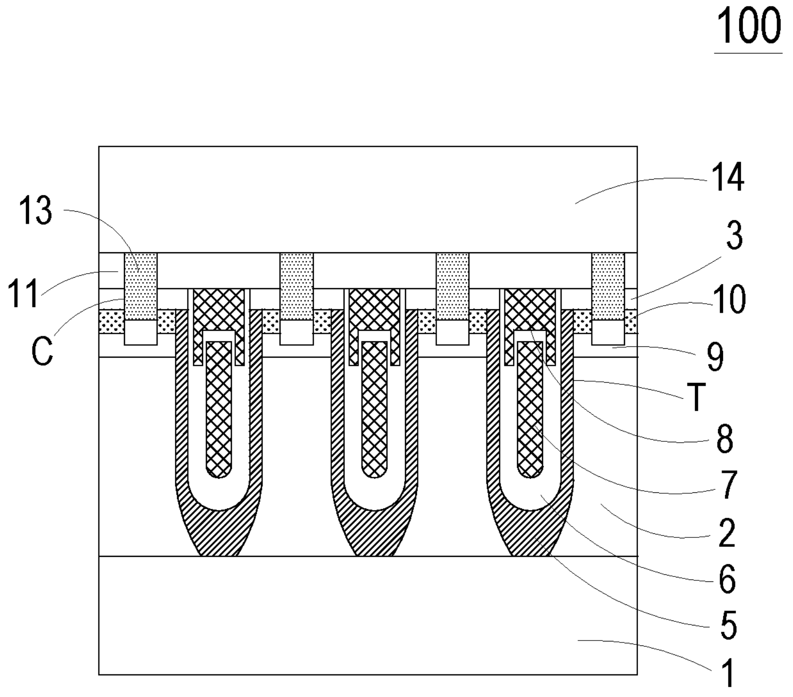
Figure 3A:
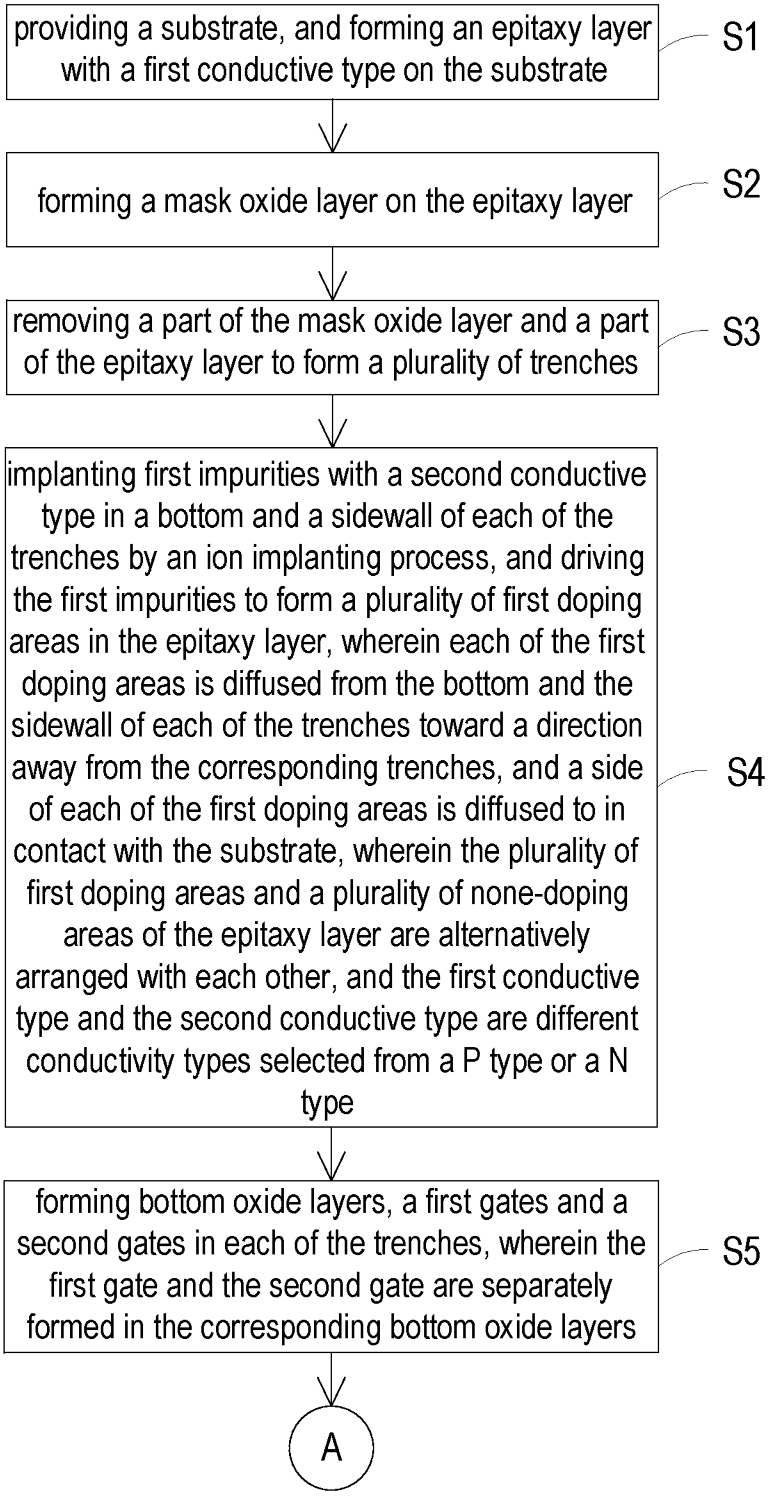
FIG. 3A and FIG. 3B schematically illustrate the flow chart of the manufacturing method of the split gate MOSFET of FIG. 2A to FIG. 2K.
Figure 3B:
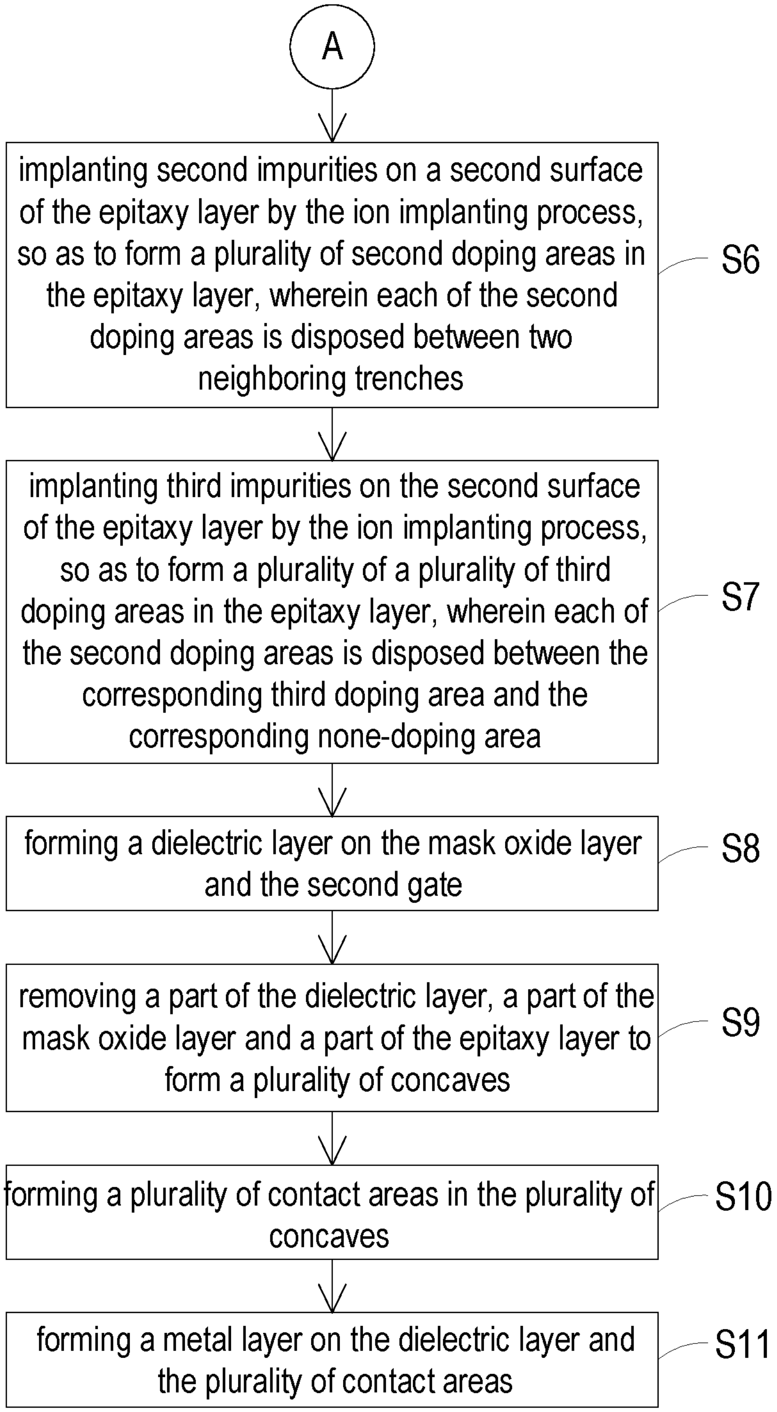

FIG. 2A to FIG. 2K schematically illustrate the flow structures of a manufacturing method of a split gate MOSFET according to an embodiment of the present disclosure, and FIG. 3A and FIG. 3B schematically illustrate the flow chart of the manufacturing method of the split gate MOSFET of FIG. 2A to FIG. 2K. As shown in FIG. 1, FIGS. 2A to 2K, FIG. 3A and FIG. 3B, the manufacturing method of the split gate MOSFET 100 of the present embodiment includes the following steps. Firstly, in step S1, a substrate 1 is provided, and an epitaxy layer 2 with a first conductive type is formed on the substrate 1, as shown in FIG. 2A. The substrate 1 can include but not limited to include N+ type semiconductor, and the epitaxy layer 2 can include but not limited to include P-type semiconductor. In step S2, a mask oxide layer 3 is formed on the epitaxy layer 2, as shown in FIG. 2B. Then, in step S3, a part of the mask oxide layer 3 and a part of the epitaxy layer 2 is removed to form a plurality of trenches T, as shown in FIG. 2C.

Then, in step S4, the first impurities with a second conductive type are implanted in the bottom TB and the sidewall TS of each trench T by an ion implanting process, and the first impurities are driven to form a plurality of first doping areas 5 in the epitaxy layer 2. In the present embodiment, the first impurities implanted to the bottom TB and the sidewall TS of each trench T can be but not limited to be N-type impurities. Each first doping area 5 is diffused from the bottom TB and the sidewall TS of each trench T toward a direction away from the trench T. A side of each first doping area 5 is diffused to contact with the substrate 1. The plurality of first doping areas 5 and the plurality of none-doping areas 20 of the epitaxy layer 2 are alternatively arranged with each other, and the first conductive type and the second conductive type are different conductivity types, as shown in FIG. 2D.

Then, in step S5, a bottom oxide layer 6, a first gate 7 and a second gate 8 are formed in each trench T, respectively. The first gate 7 and the second gate 8 are separately formed in the corresponding one of the bottom oxide layers 6, as shown in FIG. 2E. In step S6, the second are implanted on the second surface 22 of the epitaxy layer 2 by the ion implanting process, wherein the implanted second impurities include the first conductive type, which can be but not limited to be P type impurities, so as to form a plurality of second doping areas 9 in the epitaxy layer 2, and each second doping area 9 is disposed between two neighboring trenches T, as shown in FIG. 2F.

Then, in step S7, the third impurities are implanted on the second surface 22 of the epitaxy layer 2 by the ion implanting process, and the implanted third impurities include second conductive type, which can be but not limited to be N+ type impurities, so as to form a plurality of third doping areas 10 in the epitaxy layer 2. Moreover, the second doping area 9 is disposed between the third doping area 10 and the none-doping area 20, as shown in FIG. 2G. In step S8, a dielectric layer 11 is formed on the mask oxide layer 3 and the second gate 8, as shown in FIG. 2H. Then, in step S9, a part of the dielectric layer 11, a part of the mask oxide layer 3 and a part of the epitaxy layer 2 are removed to form a plurality of concaves C, as shown in FIG. 2I. In step S10, a metal material is deposed in the plurality of concaves C, so that a plurality of contact areas 13 are formed in the concaves C, respectively, as shown in FIG. 2J.

Finally, in step S11, a metal layer 14 is formed on the dielectric layer 11 and the plurality of contact areas 13, so as to form the split gate MOSFET 100, as shown in FIG. 2K. As mentioned above, since the none-doping areas 20 of the epitaxy layer 2 and the first doping area 5 respectively include P type semiconductor and N-type impurities, and are alternately arranged with each other, the super junction structure is formed therebetween, so as to achieve the effect of greatly reducing the on-resistance. In addition, since the N-type impurities are directly implanted and driven into the trenches T to form the first doping areas 5, the super junction structure is formed, and the advantages of simplifying manufacturing process and reducing cost are also achieved.

Figure 4A:
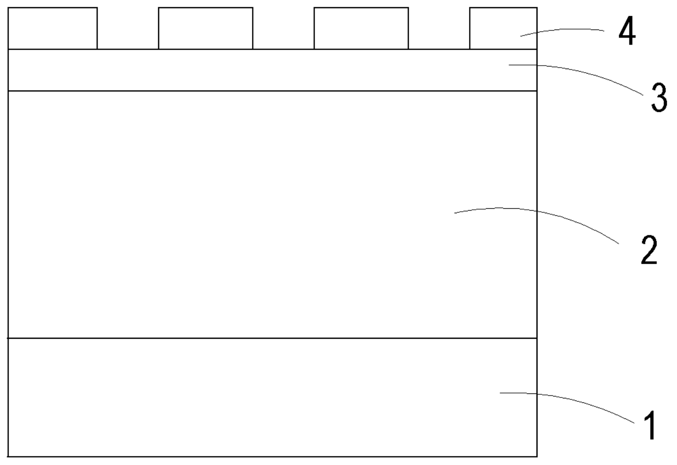
FIG. 4A to FIG. 4D schematically illustrate the flow structures of a trench manufacturing method of a split gate MOSFET according to an embodiment of the present disclosure.
Figure 4B:
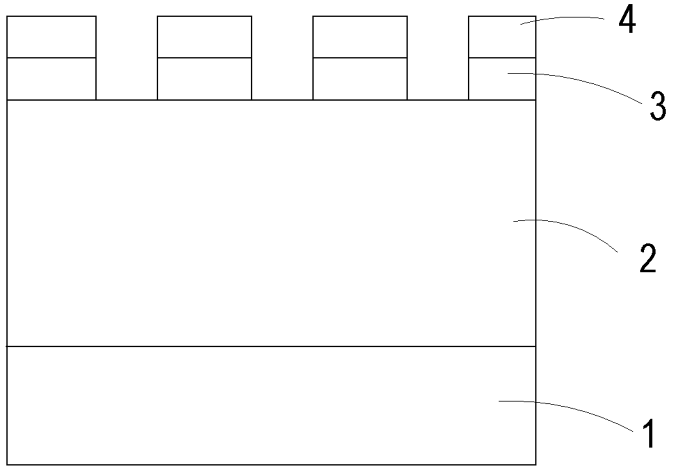
Figure 4C:
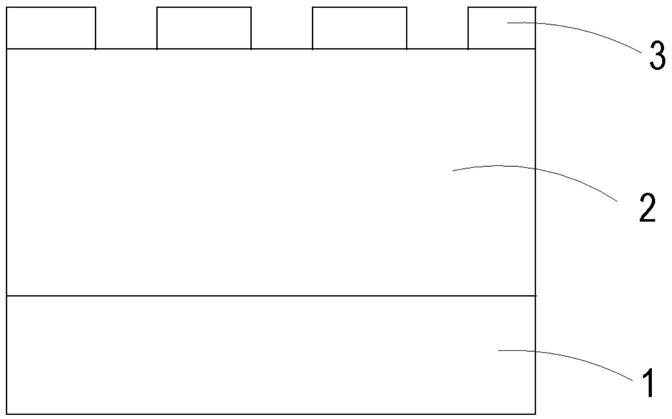
Figure 4D:
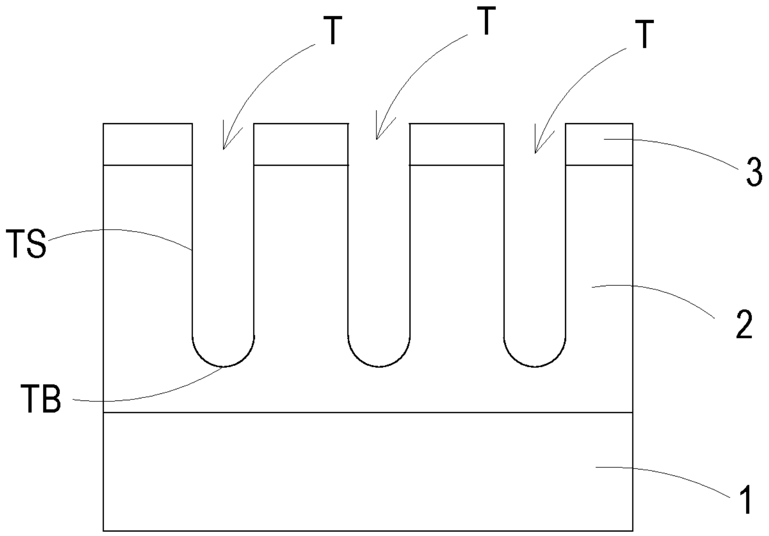
Figure 5:
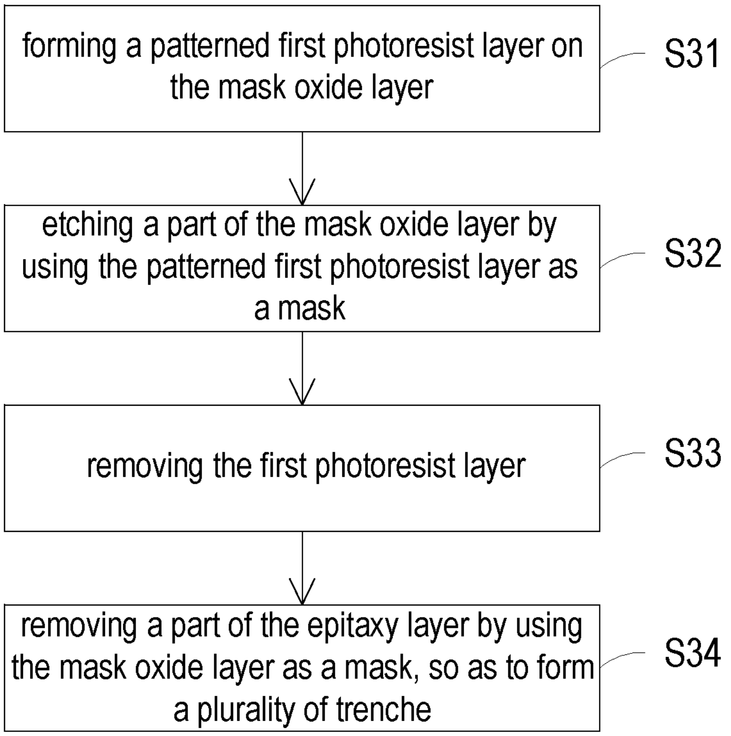
FIG. 5 schematically illustrates the flow chart of the trench manufacturing method of the split gate MOSFET of FIG. 4A to FIG. 4D.

FIG. 4A to FIG. 4D schematically illustrate the flow structures of a trench manufacturing method of a split gate MOSFET according to an embodiment of the present disclosure, and FIG. 5 schematically illustrates the flow chart of the trench manufacturing method of the split gate MOSFET of FIG. 4A to FIG. 4D. As shown in FIG. 4A to FIG. 4D and FIG. 5, the step S3 of the manufacturing method of the split gate MOSFET 100 of the present embodiment further includes the following steps. Firstly, in step S31, a patterned first photoresist layer 4 is formed on the mask oxide layer 3, as shown in FIG. 4A. Then, in step S32, at least a part of the mask oxide layer 3 is etched by using the patterned first photoresist layer 4 as a mask, as shown in FIG. 4B. In step 33, the first photoresist layer 4 is removed, as shown in FIG. 4C. Finally, in step S34, the epitaxy layer 2 is etched by using the mask oxide layer 3 as a mask, so as to form a plurality of trenches T, as shown in FIG. 4D.

Figure 6A:
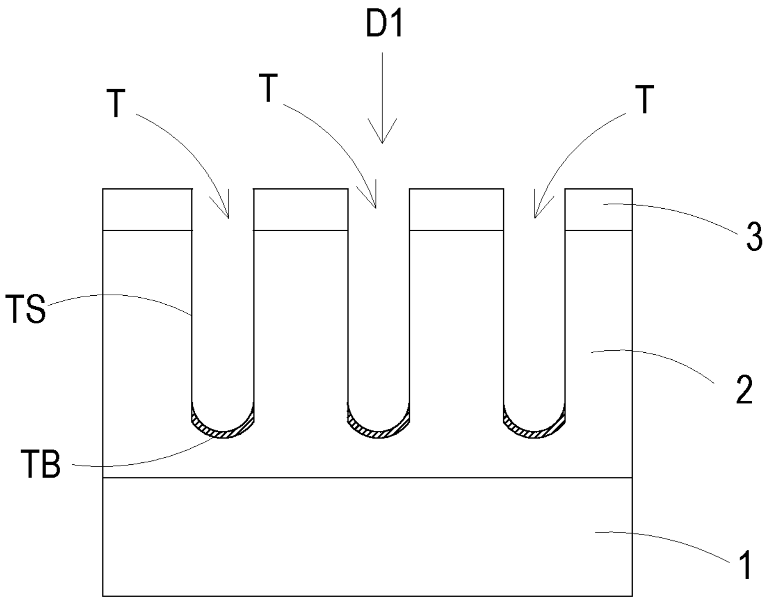
FIG. 6A to FIG. 6C schematically illustrate the flow structures of an implantation procedure of a split gate MOSFET according to an embodiment of the present disclosure.
Figure 6B:
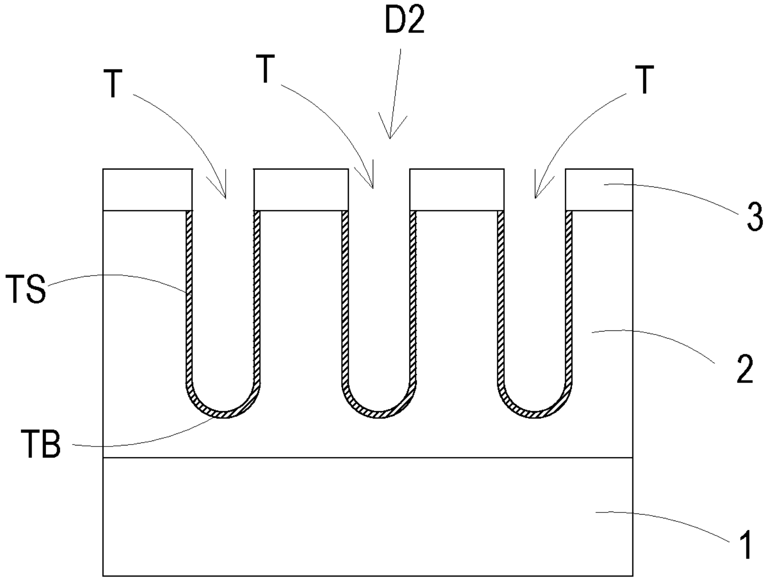
Figure 6C:
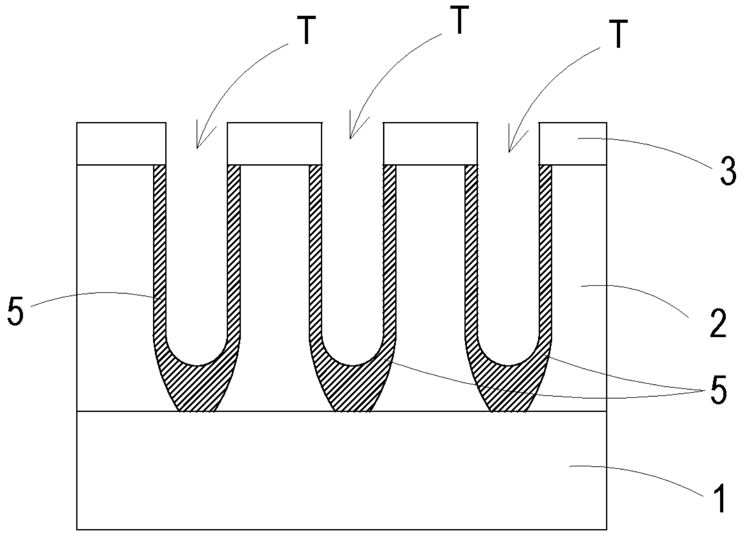
Figure 7:
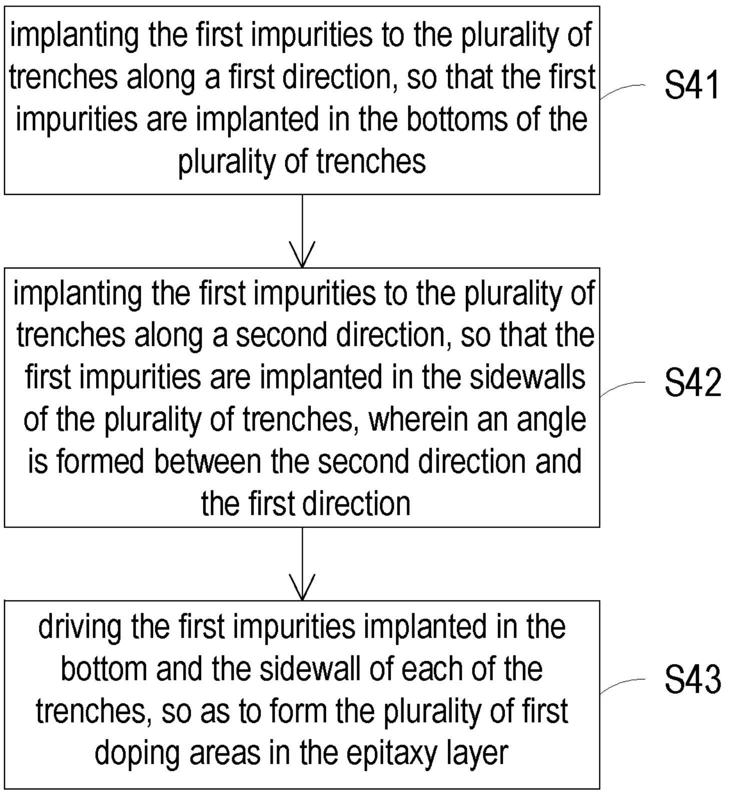
FIG. 7 schematically illustrates the flow chart of the implantation procedure of the split gate MOSFET of FIG. 6A to FIG. 6C.

FIG. 6A to FIG. 6C schematically illustrate the flow structures of an implantation procedure of a split gate MOSFET according to an embodiment of the present disclosure, FIG. 7 schematically illustrates the flow chart of the implantation procedure of the split gate MOSFET of FIG. 6A to FIG. 6C. As shown in FIG. 6A to FIG. 6C and FIG. 7, the step S4 of the manufacturing method of the split gate MOSFET 100 of the present embodiment further includes the following steps. Firstly, in step S41, the N-type first impurities are implanted to the plurality of trenches T along a first direction D1, so that the N-type first impurities are implanted in the bottoms TB of the plurality of trenches T, as shown in FIG. 6A. Then, in step S42, the N-type first impurities are implanted to the plurality of trenches T along a second direction D2, so that the N-type first impurities are implanted in the sidewalls TS of the plurality of trenches T, as shown in FIG. 6B. In the embodiment, the first direction D1 can be but not limited to be parallel to an extending direction of the trench T. Moreover, an angle is formed between the second direction D2 and the first direction D1, which can be but not limited to be 7 degrees. Finally, in step S43, the N-type first impurities implanted in the bottom TB and the sidewall TS of each trench T are driven to the epitaxy layer 2, so as to form the plurality of first doping areas 5 in the epitaxy layer 2, as shown in FIG. 6C. Consequently, the N-type first impurities are uniformly and rapidly implanted in the bottoms TB and sidewalls TS of the trenches T, and the advantages of simplifying the manufacturing process and reducing cost are achieved.

Figure 8A:
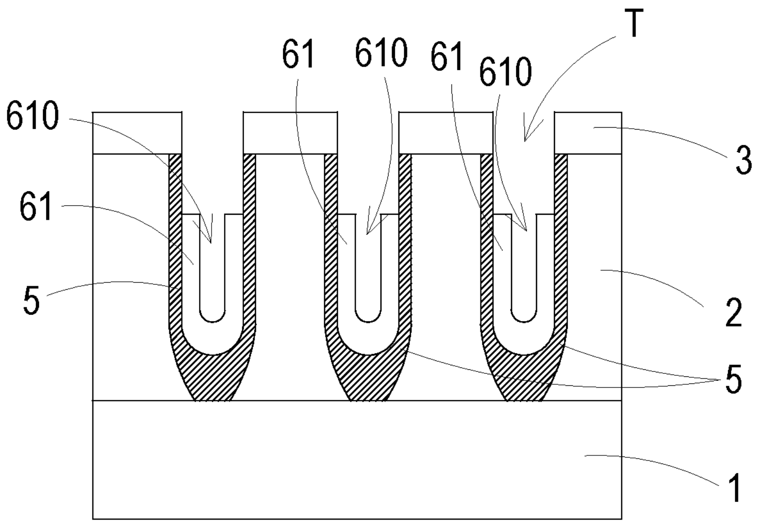
FIG. 8A to FIG. 8D schematically illustrate the flow structures of a manufacturing method of a bottom oxide layer, a first gate and a second gate of a split gate MOSFET according to an embodiment of the present disclosure.
Figure 8B:
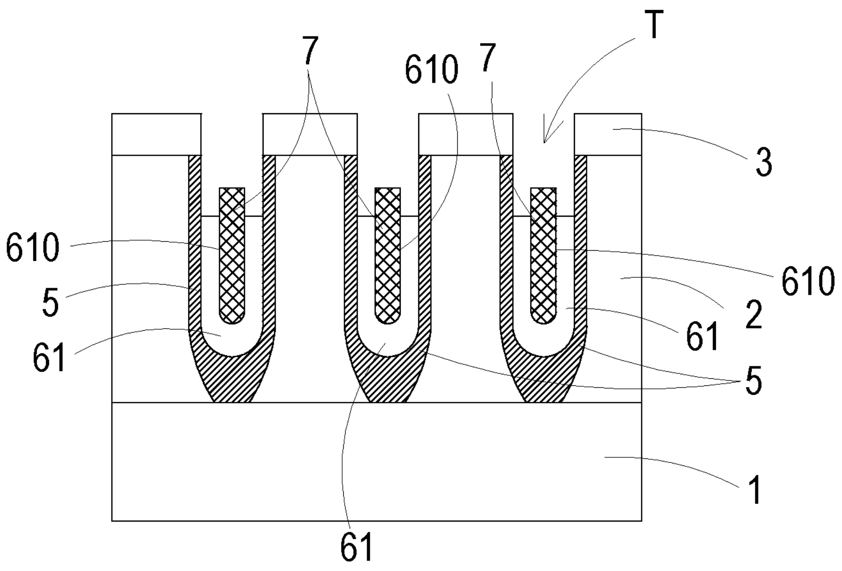
Figure 8C:
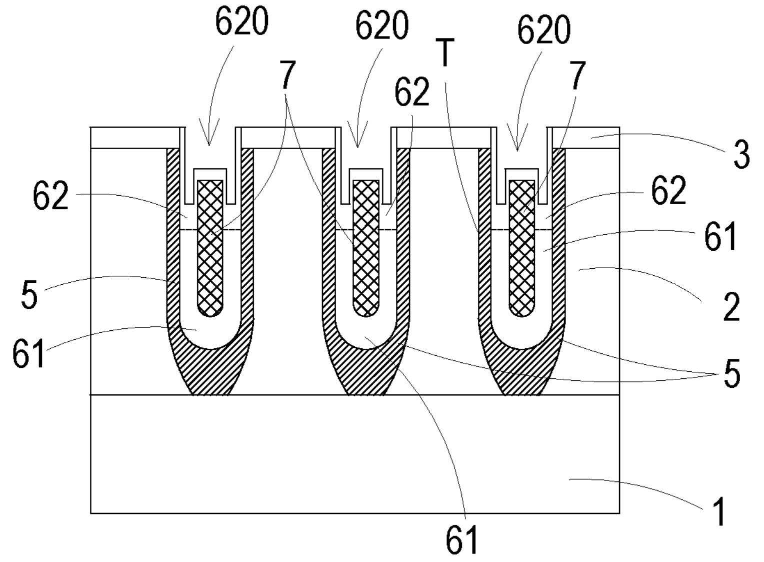
Figure 8D:
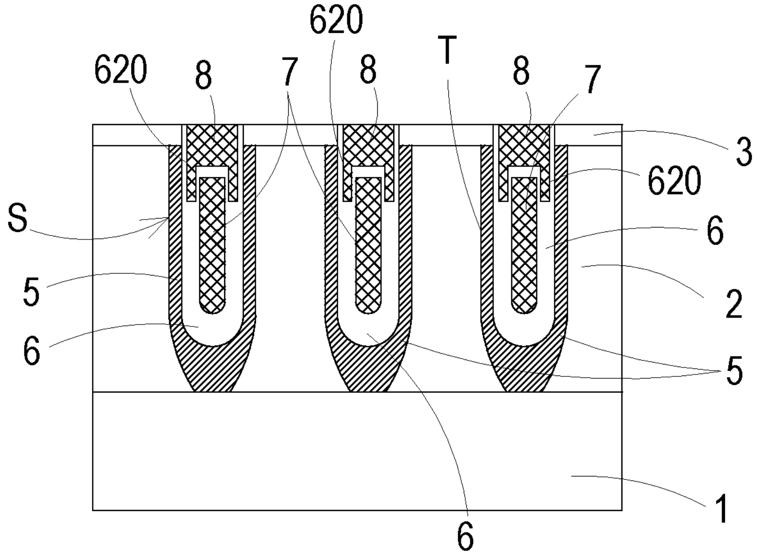
Figure 9:
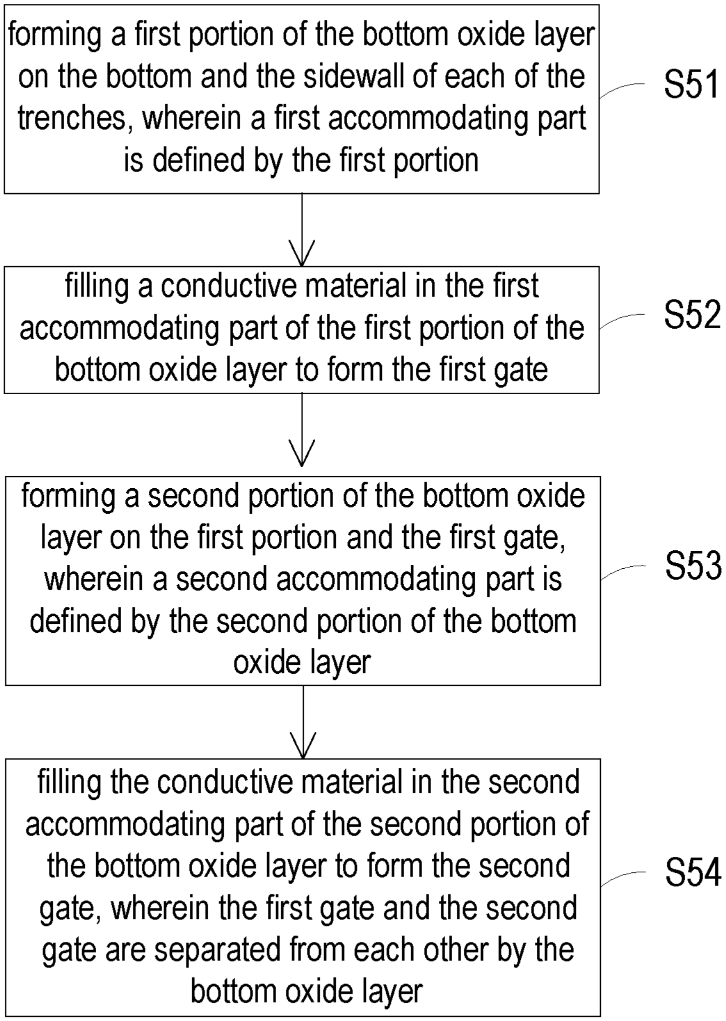
FIG. 9 schematically illustrates the flow chart of the manufacturing method of the bottom oxide layer, the first gate and the second gate of the split gate MOSFET of FIG. 8A to FIG. 8D.

FIG. 8A to FIG. 8D schematically illustrate the flow structures of a manufacturing method of a bottom oxide layer, a first gate and a second gate of a split gate MOSFET according to an embodiment of the present disclosure, and FIG. 9 schematically illustrates the flow chart of the manufacturing method of the bottom oxide layer, the first gate and the second gate of the split gate MOSFET of FIG. 8A to FIG. 8D. As shown in FIGS. 8A to 8D and FIG. 9, the step S5 of the manufacturing method of the split gate MOSFET 100 of the present embodiment further includes the following steps. Firstly, in step S51, a first portion 61 of the bottom oxide layer 6 is formed on the bottom TB and the sidewall TS of each trench T, and a first accommodating part 610 is defined by the first portion 61, as shown in FIG. 8A. Then, in step S52, a conductive material is filled into the first accommodating part 610 of the first portion 61 of the bottom oxide layer 6 to form the first gate 7, as shown in FIG. 8B. Preferably, the conductive material of the present embodiment is polysilicon. In step S53, a second portion 62 of the bottom oxide layer 6 is formed on the first portion 61 and the first gate 7, and a second accommodating part 620 is defined by the second portion 62 of the bottom oxide layer 6, as shown in FIG. 8C. Finally, in step S54, the conductive material is filled into the second accommodating part 620 of the second portion 62 of the bottom oxide layer 6 to form the second gate 8, wherein the first gate 7 and the second gate 8 are separated from each other by the bottom oxide layer 6, as shown in FIG. 8D. Preferably, the conductive material of the present embodiment is polysilicon.

Figure 10A:
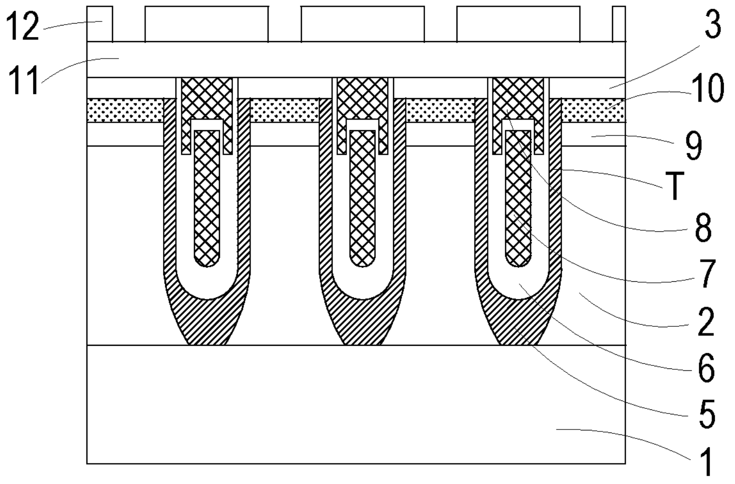
FIG. 10A to FIG. 10C schematically illustrate the flow structures of a manufacturing method of a concave of a split gate MOSFET according to an embodiment of the present disclosure.
Figure 10B:
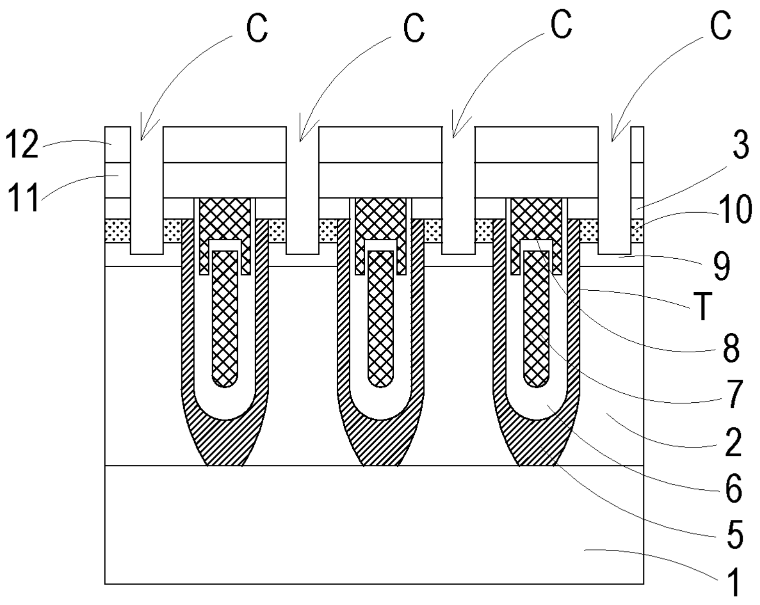
Figure 10C:
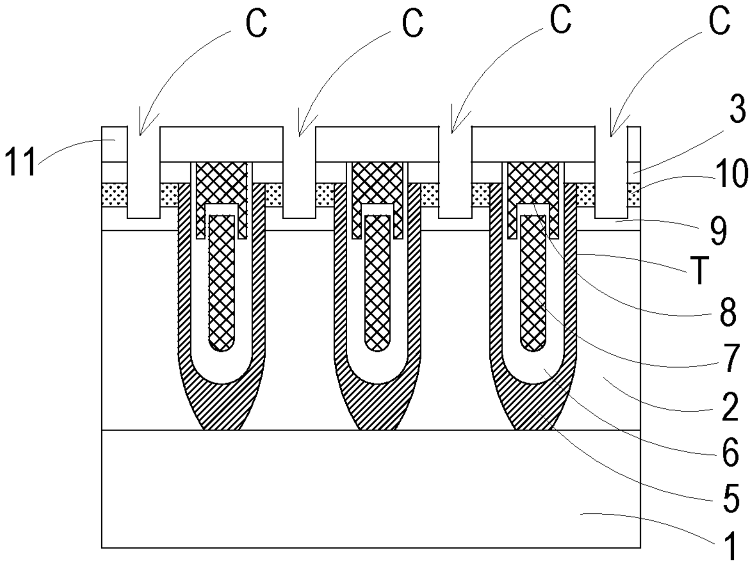
Figure 11:
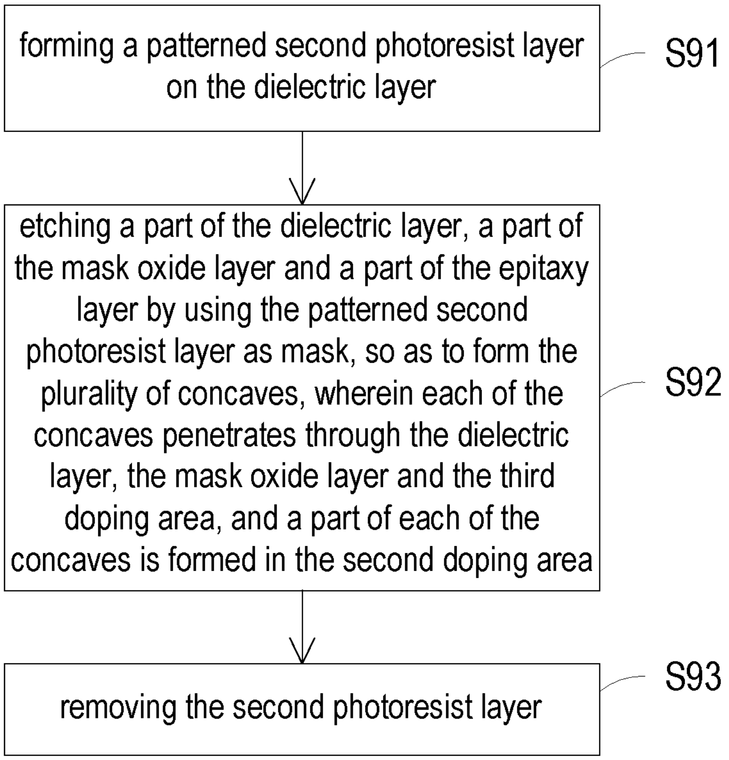
FIG. 11 schematically illustrates the flow chart of the manufacturing method of the concave of the split gate MOSFET of FIG. 10A to FIG. 10C.

FIG. 10A to FIG. 10C schematically illustrate the flow structures of a manufacturing method of a concave of a split gate MOSFET according to an embodiment of the present disclosure, and FIG. 11 schematically illustrates the flow chart of the manufacturing method of the concave of the split gate MOSFET of FIG. 10A to FIG. 10C. As shown in FIG. 10A to FIG. 10C and FIG. 11, the step S9 of the manufacturing method of the split gate MOSFET 100 of the present embodiment further includes the following steps. Firstly, in step S91, a patterned second photoresist layer 12 is formed on the dielectric layer 11, as shown in FIG. 10A. Then, in step 92, a part of the dielectric layer 11, a part of the mask oxide layer 3 and a part of the epitaxy layer 2 are etched by using the patterned second photoresist layer 12 as mask, so as to form the plurality of concaves C. Each concave C penetrates through the dielectric layer 11, the mask oxide layer 3 and the third doping area 10, and a part of each concave C is formed in the second doping area 9, as shown in FIG. 10B. Finally, in step S93, the second photoresist layer 12 is removed, as shown in FIG. 10C. Consequently, the plurality of concaves C are formed by the above-mentioned steps.

From the above descriptions, the present disclosure provides a split gate MOSFET and the manufacturing method thereof, wherein the epitaxy layer with the first conductivity type is formed on the substrate, the plurality of trenches are formed in the epitaxy layer, and the impurities with the second conductive type are implanted and driven to the sidewall and the bottom of each trench, so as to form the plurality of first doping areas. Since the plurality of first doping areas and the plurality of none-doping areas of the epitaxy layer are alternately arranged with each other, and the first conductive type and the second conductive type are different conductivity types selected from P type or N type, the split gate MOSFET including the super junction structure is manufactured, and the advantages of simplifying manufacturing process, reducing cost and greatly reducing the on-resistance are achieved.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A manufacturing method of a split gate MOSFET, including steps of:

(a) providing a substrate, and forming an epitaxy layer with a first conductive type on the substrate;

(b) forming a mask oxide layer on the epitaxy layer;

(c) removing a part of the mask oxide layer and a part of the epitaxy layer to form a plurality of trenches;

(d) implanting first impurities with a second conductive type in a bottom and a sidewall of each of the trenches by an ion implanting process, and driving the first impurities to form a plurality of first doping areas in the epitaxy layer, wherein each of the first doping areas is diffused from the bottom and the sidewall of each of the trenches toward a direction away from the corresponding trenches, and a bottom of each of the first doping areas is diffused to directly contact the substrate, wherein the plurality of first doping areas and a plurality of none-doping areas of the epitaxy layer are alternatively arranged with each other, and the first conductive type and the second conductive type are different conductivity types selected from a P type or a N type;

(e) forming bottom oxide layers, a first gates and a second gates in each of the trenches, wherein the first gate and the second gate are separately formed in the corresponding bottom oxide layers;

(f) implanting second impurities on a second surface of the epitaxy layer by the ion implanting process, so as to form a plurality of second doping areas in the epitaxy layer, wherein each of the second doping areas is disposed between two neighboring trenches;

(g) implanting third impurities on the second surface of the epitaxy layer by the ion implanting process, so as to form a plurality of a plurality of third doping areas in the epitaxy layer, wherein each of the second doping areas is disposed between the corresponding third doping area and the corresponding none-doping area;

(h) forming a dielectric layer on the mask oxide layer and the second gate;

(i) removing a part of the dielectric layer, a part of the mask oxide layer and a part of the epitaxy layer to form a plurality of concaves;

(j) forming a plurality of contact areas in the plurality of concaves; and (k) forming a metal layer on the dielectric layer and the plurality of contact areas.

2. The manufacturing method of the split gate MOSFET according to claim 1, wherein the step (c) comprises following steps:

(c1) forming a patterned first photoresist layer on the mask oxide layer;

(c2) etching a part of the mask oxide layer by using the patterned first photoresist layer as a mask;

(c3) removing the first photoresist layer; and (c4) removing a part of the epitaxy layer by using the mask oxide layer as a mask, so as to form a plurality of trenches.

3. The manufacturing method of the split gate MOSFET according to claim 1, wherein the step (d) comprises following steps:

(d1) implanting the first impurities to the plurality of trenches along a first direction, so that the first impurities are implanted in the bottoms of the plurality of trenches;

(d2) implanting the first impurities to the plurality of trenches along a second direction, so that the first impurities are implanted in the sidewalls of the plurality of trenches, wherein an angle is formed between the second direction and the first direction; and (d3) driving the first impurities implanted in the bottom and the sidewall of each of the trenches, so as to form the plurality of first doping areas in the epitaxy layer.

4. The manufacturing method of the split gate MOSFET according to claim 3, wherein the first direction is parallel to an extending direction of the trench, and the angle is 7 degrees.

5. The manufacturing method of the split gate MOSFET according to claim 1, wherein the step (e) comprises following steps:

(e1) forming a first portion of the bottom oxide layer on the bottom and the sidewall of each of the trenches, wherein a first accommodating part is defined by the first portion;

(e2) filling a conductive material in the first accommodating part of the first portion of the bottom oxide layer to form the first gate;

(e3) forming a second portion of the bottom oxide layer on the first portion and the first gate, wherein a second accommodating part is defined by the second portion of the bottom oxide layer; and (e4) filling the conductive material in the second accommodating part of the second portion of the bottom oxide layer to form the second gate, wherein the first gate and the second gate are separated from each other by the bottom oxide layer.

6. The manufacturing method of the split gate MOSFET according to claim 1, wherein the step (i) comprises following steps:

(i1) forming a patterned second photoresist layer on the dielectric layer;

(i2) etching a part of the dielectric layer, a part of the mask oxide layer and a part of the epitaxy layer by using the patterned second photoresist layer as mask, so as to form the plurality of concaves, wherein each of the concaves penetrates through the dielectric layer, the mask oxide layer and the third doping area, and a part of each of the concaves is formed in the second doping area; and (i3) removing the second photoresist layer.

7. The manufacturing method of the split gate MOSFET according to claim 1, wherein the substrate comprises N+ type semiconductors, the none-doping areas of the epitaxy layer comprise P-type semiconductors, and the first doping areas comprise N-type impurities.

8. The manufacturing method of the split gate MOSFET according to claim 1, wherein each of the contact areas comprises a first area and a second area, wherein the first area is disposed in the bottom of the concave, and comprises P type semiconductors, wherein the second area is formed on the first area, and comprises N+ type semiconductors.

* * * * *